Figure 1:
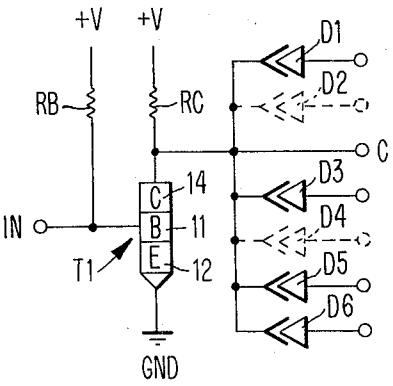
Figure 2:
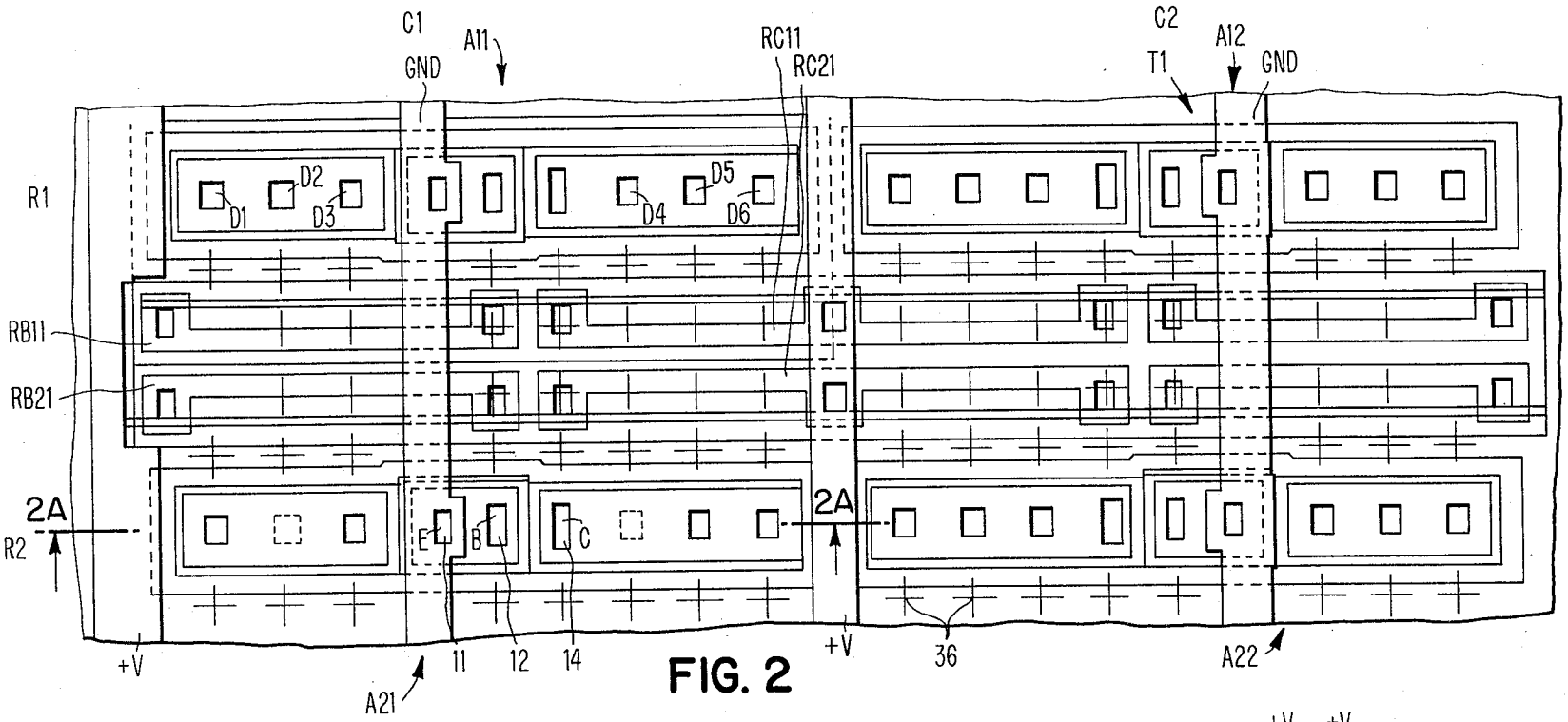
Figure 2A:
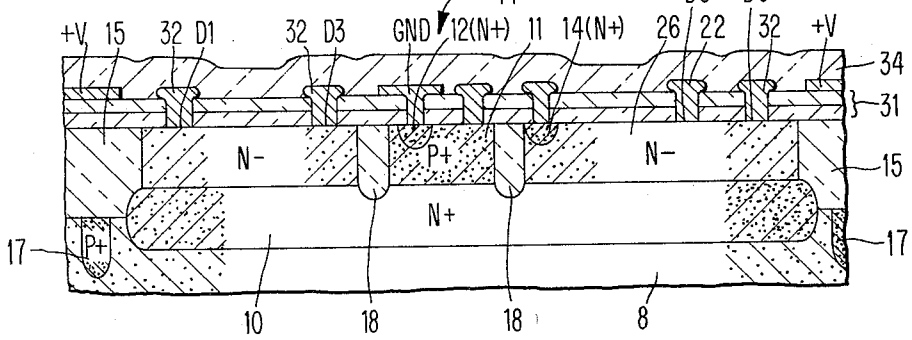
Figure 3:
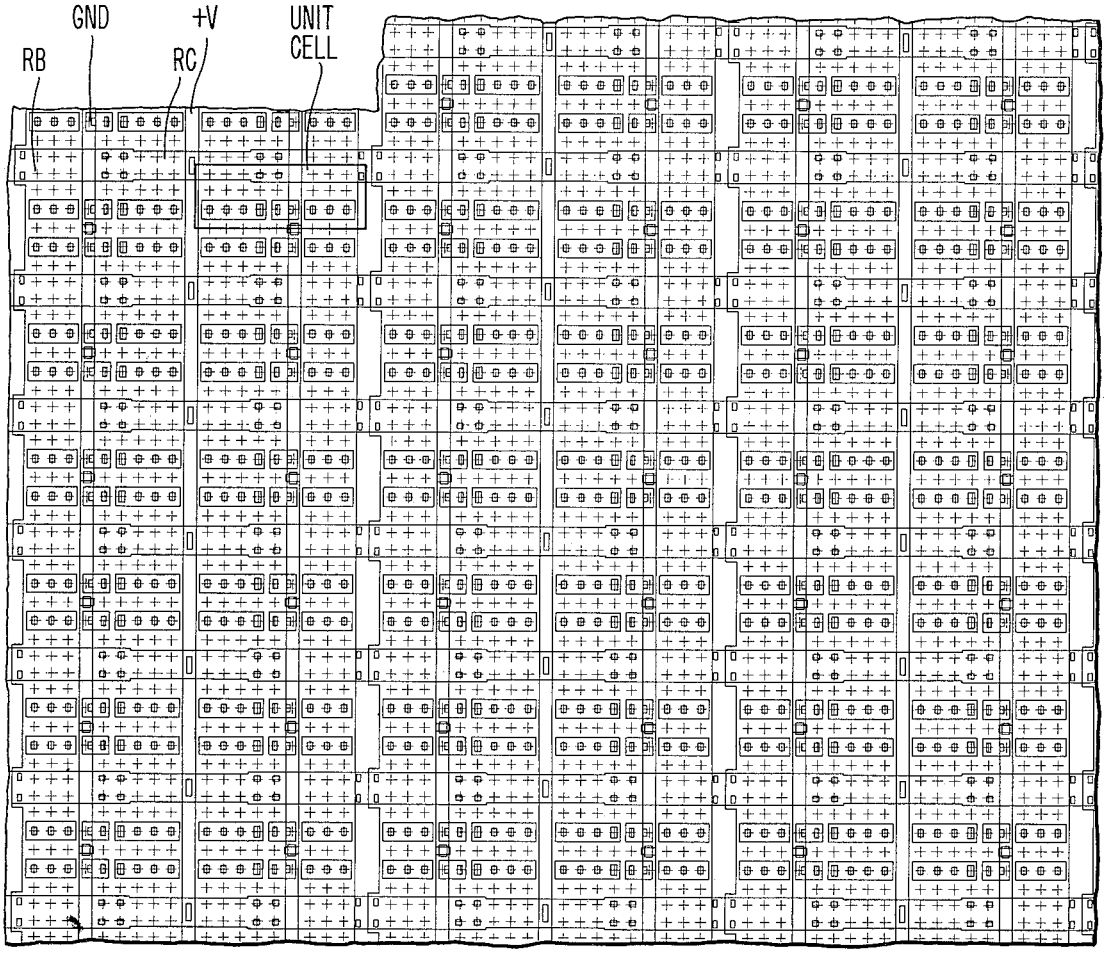
Figure 4:
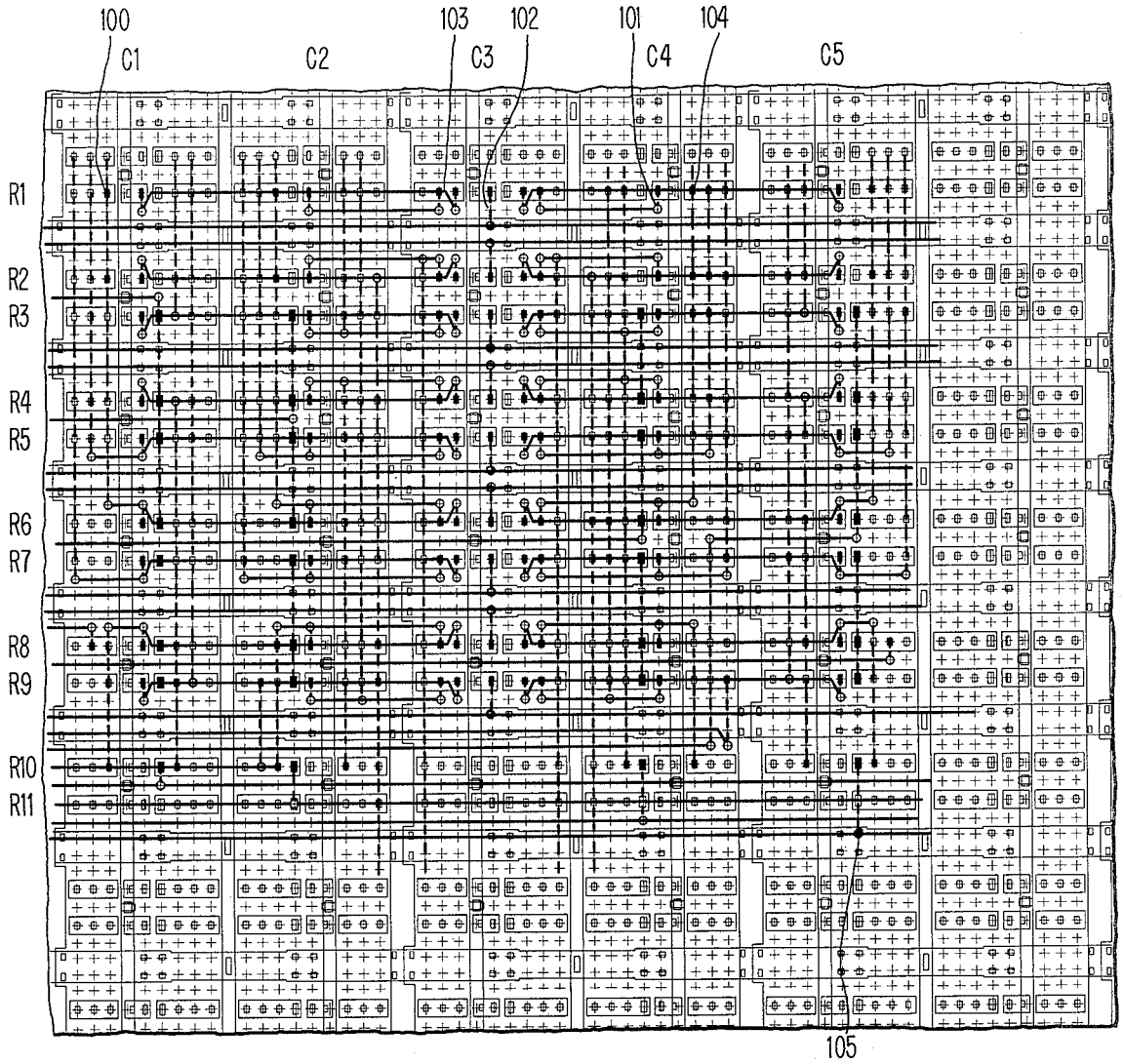
Figure 6:
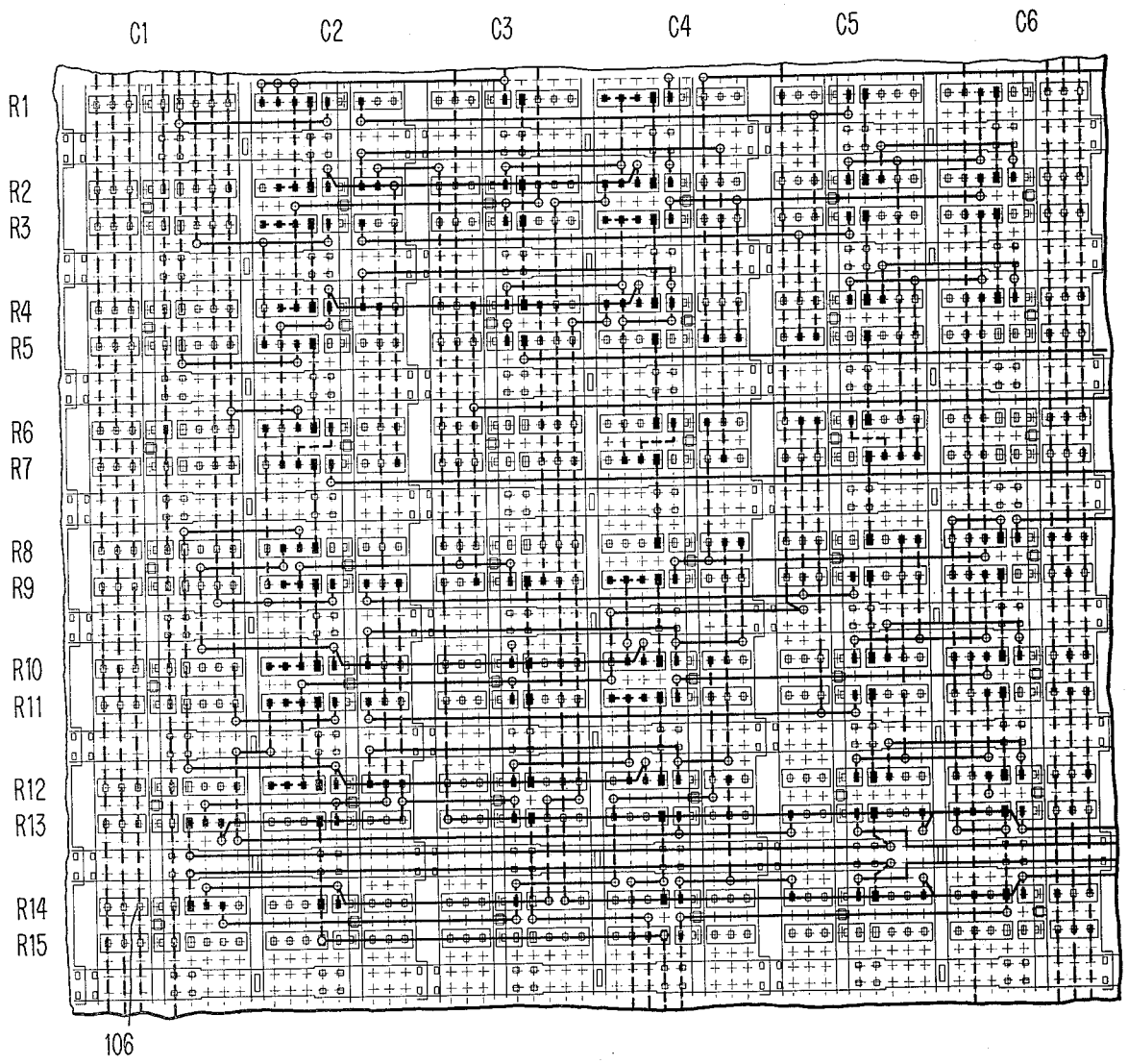
Figure 9:
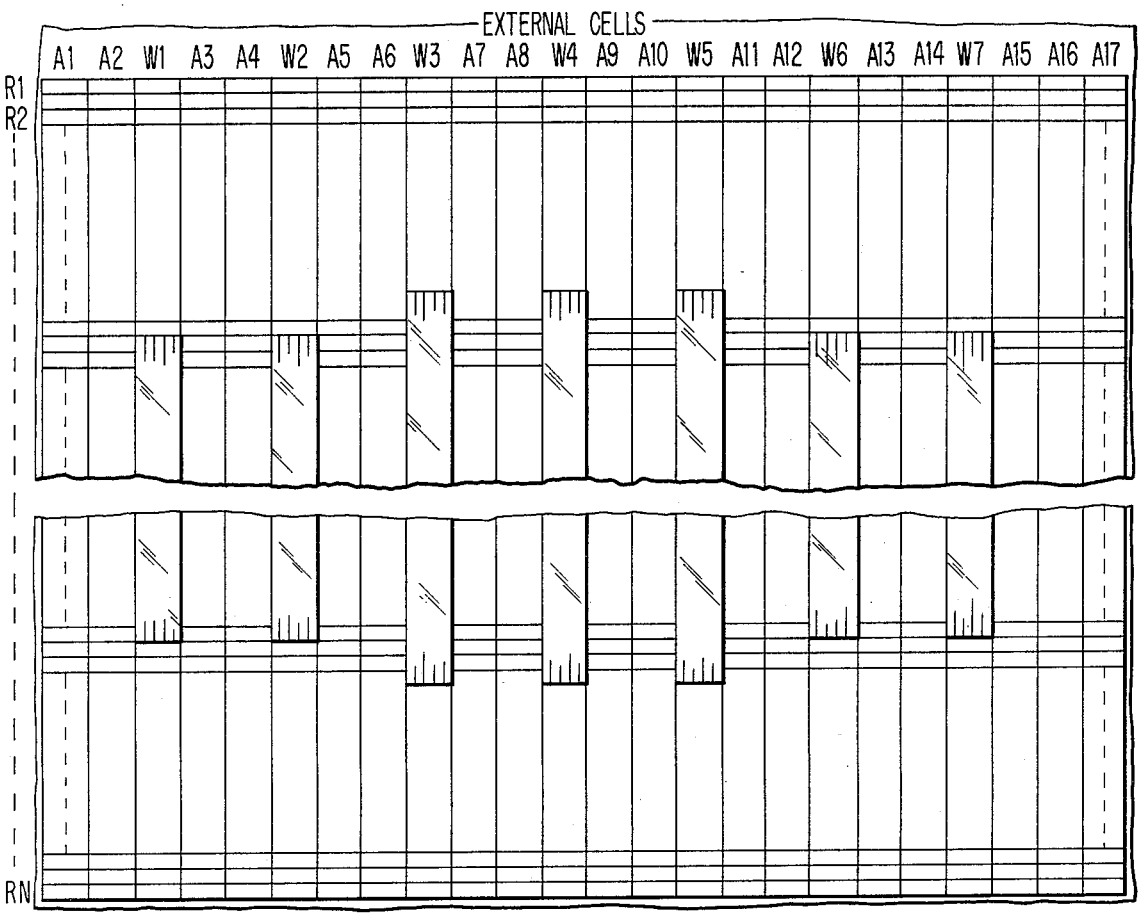
Figure 10:
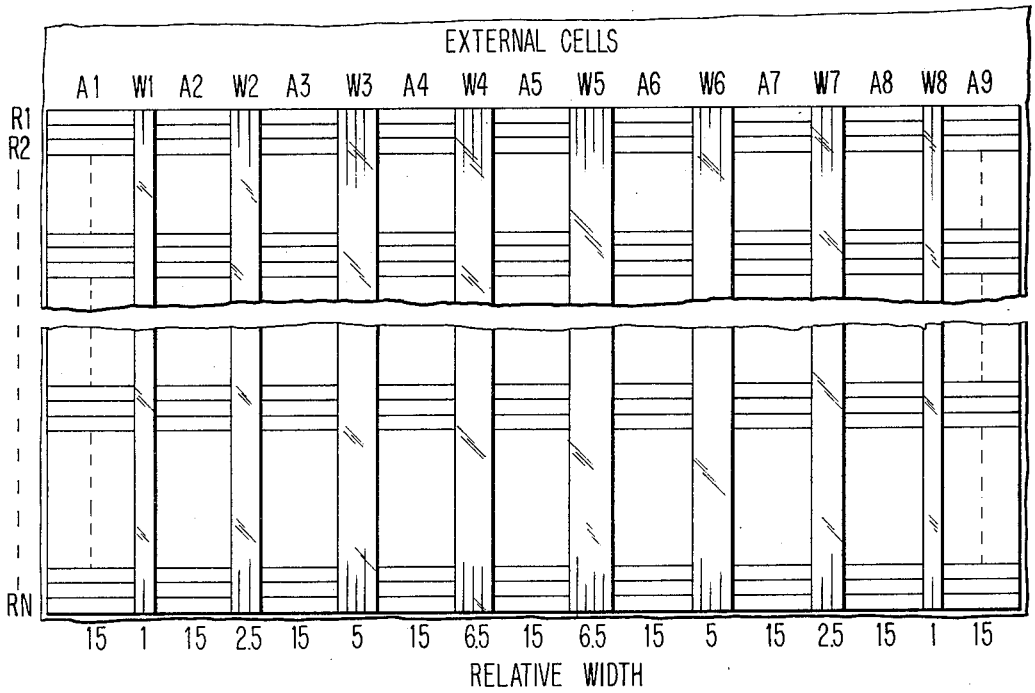

United States Defensive Publication [19] (H) [11] T100,501

Balyoz et al. [43] Apr. 7, 1981

[54] INTEGRATED CIRCUIT LAYOUT UTILIZING SEPARATED ACTIVE CIRCUIT AND WIRING REGIONS

[76] Inventors: John Balyoz, Deerwood Dr., Hopewell Junction, N.Y. 12533; Algirdas J. Gruodis, 52 Edgehill Dr., Wappinger Falls, N.Y. 12590

[21] Appl. No.: 58,360

[22] Filed: Jul. 17, 1979

Related U.S. Application Data

[63] Continuation of Ser. No. 830,715, Sep. 6, 1977, abandoned.

[51] Int. Cl.[3] ..... H01L 21/283; H01L 21/44; H01L 23/48

[52] U.S. Cl. ..... 29/577 C; 29/578; 357/45; 357/71

[57] ABSTRACT

In the method for fabricating a semiconductor substrate integrated circuit layout including: forming a plurality of spaced-apart circuit cells in columnar arrays within said substrate; forming a first insulating layer above said substrate, said layer having apertures therein to expose selected active regions of said selected cells; the improvement comprising: depositing first and second sets of elongated conductors in substantially parallel relationship atop said first insulating layer in said columnar direction; said first set being disposed directly atop said exposed cells to make selected contact with selected ones of said exposed active regions through said apertures in said first insulating layer; said second set being disposed in areas between said exposed cells; forming a second insulating layer above said first and second sets of conductors, said second insulating layer having apertures therein to expose selected ones of said first and second sets; and depositing a third set of substantially parallel, elongated conductors atop said second insulating layer, orthogonally with respect to said columnar direction, to make selected contact with said exposed ones of said first and second sets through said apertures in said second insulating layer.

1 Claim, 6 Sheets Drawing,

19 Pages Specification

The file of this unexamined application may be inspected and copies thereof may be purchased (849 O.G. 1221, Apr. 9, 1968).

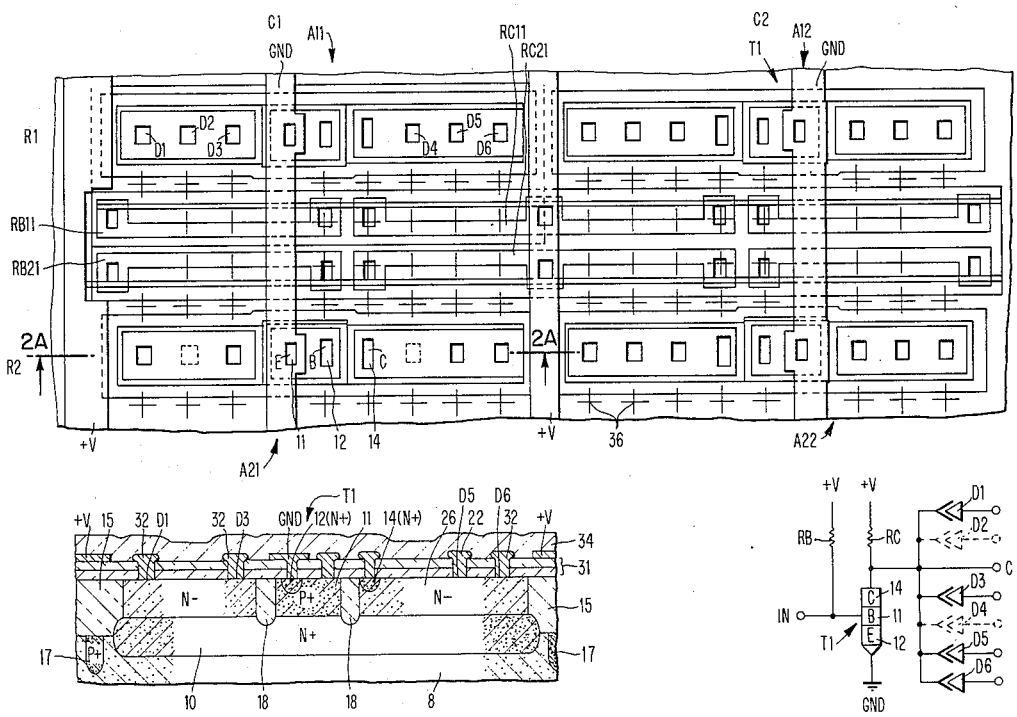

| | C1 | C2 | C3 | C4 | C5 |
|---|---|---|---|---|---|
| R1 | A | A | A | A | A |
| R2 | A | A | A | A | A |
| R3 | A | A | A | A | A |
| R4 | A | A | A | A | A |
| R5 | A | A | A | A | A |
| R6 | A | A | A | A | A |
| R7 | A | A | A | A | A |
| R8 | A | A | A | A | A |
| R9 | A | A | A | A | A |
| R10 | A | A | A | A | A |
| R11 | W | W | W | W | W |

FIG. 5

| | C1 | | C2 | C3 | C4 | C5 | C6 | |
|---|---|---|---|---|---|---|---|---|
| R1 | W | | A | A | A | A | A | W |
| R2 | W | | A | A | A | A | A | W |
| R3 | W | | A | A | A | A | A | W |
| R4 | W | | A | A | A | A | A | W |
| R5 | W | | A | A | A | A | W | |
| R6 | W | | A | W | A | A | W | |
| R7 | W | | A | W | A | A | W | |
| R8 | W | | A | W | A | A | A | W |
| R9 | W | | A | A | A | A | A | W |
| R10 | W | | A | A | A | A | A | W |
| R11 | W | | A | A | A | A | A | W |
| R12 | W | | A | A | A | A | A | W |
| R13 | W | A | A | A | A | A | A | W |
| R14 | W | A | A | A | A | A | A | W |
| R15 | W | | W | W | W | W | W | W |

FIG. 7

| | C1 | C2 | C3 | C4 | C5 | C6 | C7 |
|---|---|---|---|---|---|---|---|
| R1 | W | A | A | A | W | A | A |
| R2 | W | A | A | A | W | A | A |
| R3 | W | A | A | A | W | A | A |
| R4 | W | A | A | A | W | A | A |
| R5 | W | A | A | A | W | A | A |
| R6 | W | A | A | A | W | A | A |
| R7 | W | A | A | A | W | A | A |
| R8 | W | A | A | A | W | A | A |
| R9 | W | W | W | W | W | W | W |
| R10 | W | A | A | A | W | A | A |
| R11 | W | A | A | A | W | A | A |
| R12 | W | A | A | A | W | A | A |

FIG. 8